United States Patent
Vukovic

(10) Patent No.: US 8,252,114 B2
(45) Date of Patent: Aug. 28, 2012

(54) GAS DISTRIBUTION SYSTEM AND METHOD FOR DISTRIBUTING PROCESS GAS IN A PROCESSING SYSTEM

(75) Inventor: Mirko Vukovic, Slingerlands, NY (US)

(73) Assignee: Tokyo Electron Limited, Tokyo (JP)

( * ) Notice: Subject to any disclaimer, the term of this patent is extended or adjusted under 35 U.S.C. 154(b) by 881 days.

(21) Appl. No.: 12/058,070

(22) Filed: Mar. 28, 2008

(65) Prior Publication Data

US 2009/0246374 A1    Oct. 1, 2009

(51) Int. Cl.
- *C23C 16/455* (2006.01)
- *C23F 1/00* (2006.01)
- *H01L 21/306* (2006.01)
- *C23C 16/06* (2006.01)
- *C23C 16/22* (2006.01)

(52) U.S. Cl. ............... 118/715; 156/345.33; 156/345.34

(58) Field of Classification Search .......... 118/715; 156/345.33, 345.34
See application file for complete search history.

(56) References Cited

U.S. PATENT DOCUMENTS

| | | | | |
|---|---|---|---|---|
| 3,215,508 A * | 11/1965 | Piester | ............... | 422/143 |
| 4,512,283 A * | 4/1985 | Bonifield et al. | ......... | 118/723 E |
| 4,778,559 A * | 10/1988 | McNeilly | ............... | 118/728 |
| 4,825,809 A * | 5/1989 | Mieno | ............... | 118/725 |
| 5,009,738 A * | 4/1991 | Gruenwald et al. | ..... | 156/345.47 |
| 5,105,761 A * | 4/1992 | Charlet et al. | ......... | 118/723 ME |
| 5,106,453 A * | 4/1992 | Benko et al. | ......... | 117/93 |
| 5,114,529 A * | 5/1992 | Masuyama et al. | ......... | 438/725 |
| 5,134,963 A * | 8/1992 | Barbee et al. | ......... | 118/715 |
| 5,186,756 A * | 2/1993 | Benko et al. | ......... | 118/730 |
| 5,366,557 A * | 11/1994 | Yu | ......... | 118/725 |
| 5,643,394 A * | 7/1997 | Maydan et al. | ......... | 156/345.33 |
| 5,741,363 A * | 4/1998 | Van Buskirk et al. | ......... | 118/715 |
| 5,968,275 A * | 10/1999 | Lee et al. | ......... | 118/723 R |
| 6,010,748 A * | 1/2000 | Van Buskirk et al. | ..... | 427/248.1 |
| 6,079,356 A * | 6/2000 | Umotoy et al. | ......... | 118/723 E |
| 6,225,745 B1 * | 5/2001 | Srivastava | ......... | 315/111.51 |
| 6,444,039 B1 * | 9/2002 | Nguyen | ......... | 118/715 |
| 6,514,348 B2 * | 2/2003 | Miyamoto | ......... | 118/715 |
| 6,537,419 B1 * | 3/2003 | Kinnard | ......... | 156/345.34 |
| 6,635,117 B1 * | 10/2003 | Kinnard et al. | ......... | 118/723 R |
| 6,761,796 B2 * | 7/2004 | Srivastava et al. | ......... | 156/345.38 |
| 6,782,843 B2 * | 8/2004 | Kinnard et al. | ......... | 118/723 E |
| 6,800,139 B1 * | 10/2004 | Shinriki et al. | ......... | 118/715 |
| 6,872,258 B2 * | 3/2005 | Park et al. | ......... | 118/715 |
| 6,872,259 B2 * | 3/2005 | Strang | ......... | 118/715 |
| 7,037,846 B2 * | 5/2006 | Srivastava et al. | ......... | 438/710 |
| 7,418,921 B2 * | 9/2008 | Tsuji et al. | ......... | 118/723 E |

(Continued)

FOREIGN PATENT DOCUMENTS

JP    01084717 A *  3/1989

(Continued)

*Primary Examiner* — Rudy Zervigon
(74) *Attorney, Agent, or Firm* — Wood, Herron & Evans, LLP

(57) ABSTRACT

An apparatus and related method for distributing process gas in a vapor deposition system is described. The gas distribution system includes a vertically movable piston within its plenum, and the movement of the piston controls the flow rate of process gas through the vapor distribution plate of the gas distribution system. The piston can be used to accommodate changes in processing parameters that affect flow characteristics and to create edge-enhanced, uniform, and center-enhanced profiles of deposited material on a substrate without the need to replace the vapor distribution plate.

17 Claims, 3 Drawing Sheets

U.S. PATENT DOCUMENTS

| | | | |
|---|---|---|---|
| 7,449,416 B2 * | 11/2008 | Becknell et al. | 438/725 |
| 7,807,222 B2 * | 10/2010 | Kuznetsov | 427/249.15 |
| 7,892,357 B2 * | 2/2011 | Srivastava | 118/715 |
| 8,147,614 B2 * | 4/2012 | White et al. | 118/715 |
| 2003/0000469 A1 * | 1/2003 | Pyo | 118/715 |
| 2003/0019580 A1 * | 1/2003 | Strang | 156/345.33 |
| 2003/0024900 A1 * | 2/2003 | Johnson | 216/59 |
| 2003/0205328 A1 * | 11/2003 | Kinnard et al. | 156/345.37 |
| 2004/0050496 A1 * | 3/2004 | Iwai et al. | 156/345.51 |
| 2004/0082251 A1 * | 4/2004 | Bach et al. | 445/60 |
| 2004/0140054 A1 * | 7/2004 | Johnson | 156/345.43 |
| 2004/0235299 A1 * | 11/2004 | Srivastava et al. | 438/689 |
| 2004/0261712 A1 * | 12/2004 | Hayashi et al. | 118/723 E |
| 2005/0150601 A1 * | 7/2005 | Srivastava | 156/345.33 |
| 2008/0178805 A1 * | 7/2008 | Paterson et al. | 118/723 I |
| 2009/0246374 A1 * | 10/2009 | Vukovic | 427/255.28 |
| 2010/0243166 A1 * | 9/2010 | Hayashi | 156/345.34 |

FOREIGN PATENT DOCUMENTS

| | | | |
|---|---|---|---|
| JP | 2000173927 A | * | 6/2000 |
| JP | 2002033311 A | * | 1/2002 |

* cited by examiner

GAS DISTRIBUTION SYSTEM AND METHOD FOR DISTRIBUTING PROCESS GAS IN A PROCESSING SYSTEM

BACKGROUND OF THE INVENTION

1. Field of Invention

The present invention relates to a method and system for thin film deposition, and more particularly to a system for improving the gas distribution of metal layers formed from metal precursors in uniform, center-enhanced, and edge-enhanced profiles.

2. Description of Related Art

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperature between about 400° C. and about 500° C., or lower.

For example, Cu integration schemes for technology nodes less than or equal to 130 nm can utilize a low dielectric constant (low-k) inter-level dielectric, followed by a physical vapor deposition (PVD) Ta layer or a TaN/Ta layer, followed by a PVD Cu seed layer, and an electro-chemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, these studies including such materials as chromium, tantalum, molybdenum, and tungsten. Each of these materials exhibits low miscibility in Cu. More recently, other materials, such as ruthenium (Ru) and rhodium (Rh), have been identified as barrier layers since they have been found to behave similarly to conventional refractory metals. However, the use of Ru or Rh can permit the use of only one barrier layer, as opposed to two layers, such as Ta/TaN. This observation is due to the adhesive and barrier properties of these materials. For example, one Ru layer can replace the Ta/TaN barrier layer. Moreover, current research is finding that the one Ru layer can further replace the Cu seed layer, and bulk Cu fill can proceed directly following Ru deposition. This observation is due to good adhesion between the Cu and the Ru layers.

Conventionally, barrier layers can be formed by thermally decomposing a metal precursor, such as a ruthenium carbonyl precursor, in a thermal chemical vapor deposition (TCVD) process. In low-pressure TCVD systems, the flow of precursor gas is influenced by radial diffusion after the precursor gas leaves a gas distribution system. Consequently, the barrier layer formed on a dielectric material or substrate typically has a center-enhanced dome profile, even when the flow of precursor gas out of the gas distribution system is uniform.

One solution to the forgoing problem is to install a vapor distribution plate at the outlet of a gas distribution system that has more orifices around the edge region of the plate compared to the central region to create higher precursor gas flow through the edge region, i.e., edge-enhanced flow. However, if any process parameter such as pressure, temperature, precursor-type, or gas flow rate change, the system may then require a re-designed vapor distribution plate to accomplish a similar gas flow profile that achieves uniform thickness for a barrier layer formed on substrate. In addition, the vapor distribution plate is fixed in the system and not easily and/or quickly replaceable, such that the system cannot be easily changed to accommodate process parameter changes or to accomplish uniform flow or center-enhanced flow in the event that edge-enhanced flow is not desired.

There is thus a need for a vapor distribution system in which the precursor gas flow can be controlled and changed to accommodate process parameter changes or to switch from edge-enhanced to uniform to center-enhanced flow, as desired, and that does not rely solely upon changing the orifice pattern in the vapor distribution plate to accomplish flow control.

SUMMARY OF THE INVENTION

A gas distribution system is provided for controlling the depositing of a layer on a substrate in a processing chamber. According to an embodiment, the gas distribution system includes a housing with an inlet and an outer circumferential edge, a vapor distribution plate coupled to the housing, and a plenum located between the inlet and the vapor distribution plate. The vapor distribution plate includes a plurality of orifices for delivering process gas from the plenum to the processing chamber. The gas distribution system further includes a piston disposed in the plenum, where the piston is vertically movable from an upper position to a lower position. A flow path for the process gas is defined in the system to extend from the inlet, through an upper plenum portion between the piston and the outer circumferential edge, and to a lower plenum portion between the piston and the vapor distribution plate. When the piston is in the upper position, the process gas flows uniformly through the orifices in the vapor distribution plate. When the piston is in the lower position, the process gas flow is greater through an outer radial portion of the vapor distribution plate than the flow through a central radial portion of the vapor distribution plate.

A method for distributing the process gas into the process chamber of a deposition system is also provided. The method includes introducing the process gas into the inlet of the vapor distribution system described above, moving the piston to a desired location in the plenum, flowing the process gas from the inlet to the upper plenum portion located between the outer circumferential edge of the housing and the piston and further to the lower plenum portion located between the piston and the vapor distribution plate, and flowing the process gas through the plurality of orifices in the vapor distribution plate and into the process chamber of the deposition system. The desired location of the piston determines the relative flow of process gas through the central radial portion of the vapor distribution plate and the outer radial portion of the vapor distribution plate.

DETAILED DESCRIPTION OF SEVERAL EMBODIMENTS

Figure 1:
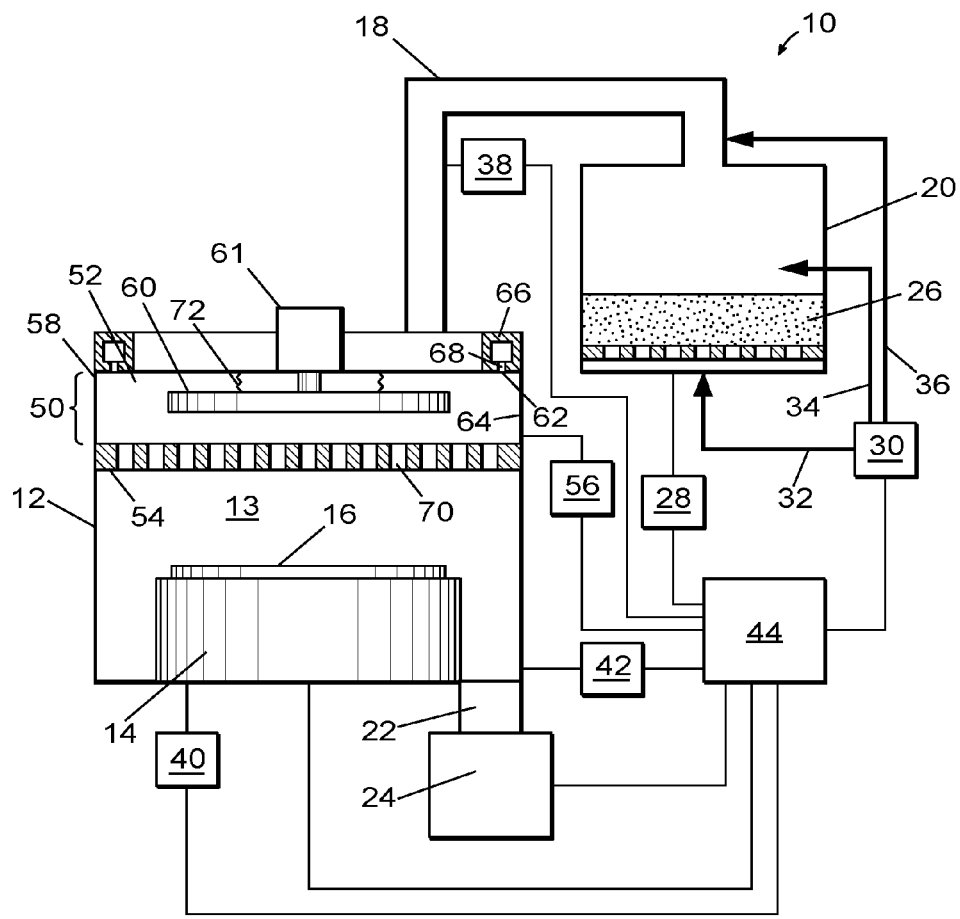
FIG. 1 is a schematic view of a deposition system including an embodiment of the gas distribution system of the invention.

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

The invention is directed to use of a piston in the vapor distribution system of a chemical vapor deposition processing system for varying relative flow of a process gas through central and outer (edge) portions of a vapor distribution plate (showerhead) to achieve a desired uniformity in thickness of a deposited metal layer. According to one embodiment of the invention, the gas distribution system includes the vapor distribution plate coupled to a housing having an inlet and an outer circumferential edge, and a plenum located between the inlet and the vapor distribution plate. The vapor distribution plate includes a plurality of orifices for delivering the process gas from the plenum to the processing chamber. The piston is disposed in the plenum, and is vertically movable between an upper position and a lower position. A flow path for the process gas is defined to extend from the inlet, through an upper plenum portion between the piston and the outer circumferential edge, and to a lower plenum portion between the piston and the vapor distribution plate. In general, when the piston is in the upper position, the process gas flows uniformly through the orifices in the vapor distribution plate, and when the piston is in the lower position, the process gas flow is greater through an outer radial portion of the vapor distribution plate than the flow through a central radial portion of the vapor distribution plate. However, different orifice patterns and plenum configurations can be used that will alter these general flow principles.

In further embodiments of the invention, the gas distribution system can also include a bellows coupled to the piston and the housing to maintain a vacuum in the system, as necessary. The system may further incorporate overlapping concentric shields to prevent particles from the bellows from entering the plenum or processing chamber. The inlet of the housing can comprise a gas delivery ring with multiple circumferential orifices that deliver the process gas adjacent to the outer circumferential edge of the housing.

The pattern of orifices in the vapor distribution plate can be radially uniform or radially non-uniform. In one embodiment of the system, the vapor distribution plate has a greater number of orifices in the central radial portion of the plate compared to the outer radial portion of the plate. In this embodiment, moving the piston to the upper position causes a higher process gas flow through the central radial portion of the plate than through the outer radial portion of the plate, i.e., center-enhanced flow. As the plenum is moved toward the lower position, flow will become more uniform, and in the lowest position, flow may be edge-enhanced, depending on the spacing between the piston and the vapor distribution plate. In another embodiment, the vapor distribution plate has a greater number of orifices in the outer radial portion of the plate compared to the central radial portion of the plate. In this embodiment, moving the piston to either the upper or lower position causes a higher process gas flow through the outer radial portion of the plate than through the central radial portion of the plate, i.e., edge-enhanced flow.

In one embodiment of the system, the piston has a flat profile oriented substantially parallel to the vapor distribution plate. In another embodiment, the piston has a convex profile oriented towards the vapor distribution plate. Different embodiments of the system can include any combination of the piston profiles and the orifice patterns. For example, the piston may have a convex profile and the orifice pattern may be non-uniform with a greater number in the central radial portion than the outer radial portion for center-enhanced flow.

Embodiments of the invention further include methods for distributing a process gas into a process chamber of a deposition system. The method includes introducing a process gas into the inlet of the vapor distribution system, moving the piston to a desired location in the plenum, flowing the process gas from the inlet to an upper plenum portion located between the outer circumferential edge of the housing and the piston and further to a lower plenum portion located between the piston and the vapor distribution plate, and flowing the process gas through the plurality of orifices in the vapor distribution plate and into the process chamber of the deposition system. The desired location of the piston determines the relative flow of process gas through a central radial portion of the vapor distribution plate and an outer radial portion of the vapor distribution plate.

In one embodiment of the method, the process gas contains a metal-carbonyl precursor. In a further embodiment of the method, the process chamber includes a substrate holder and a substrate, and the method further includes exposing the substrate to the process gas flowing into the process chamber to create a metal layer on the substrate by a chemical vapor deposition process.

In one embodiment of the method, the piston has a flat profile facing the vapor distribution plate and the plurality of orifices in the plate is located in a radially uniform pattern. In this embodiment, the method also includes moving the piston to an upper position so that the piston is about 0.5 inch to about 2.0 inches above the vapor distribution plate to cause generally uniform flow of the process gas through the outer and central radial portions of the plate. In an alternate embodiment, the method includes moving the piston to a lower position so that the piston is about 0.05 inch to about 0.4 inch above the vapor distribution plate to cause a higher relative flow of process gas through the outer radial portion of the plate than through the central radial portion of the plate.

In yet another embodiment of the method, the piston has a convex profile facing the vapor distribution plate and the plurality of orifices in the plate is located in a radially non-uniform pattern with more orifices in the central radial portion of the plate compared to the outer radial portion of the plate. In this embodiment, the method also includes moving the piston to an upper position so that the piston is about 0.5 inch to about 2.0 inches above the vapor distribution plate to cause a higher relative flow of process gas through the central radial portion of the plate than through the outer radial portion of the plate. In an alternate embodiment, the method includes moving the piston to a lower position so that the piston is about 0.05 inch to about 0.4 inch above the vapor distribution plate to cause generally uniform flow of the process gas through the outer and central radial portions of the plate.

The invention will now be further described with reference to the drawings, wherein like reference numerals designate identical or corresponding parts throughout the several views. FIG. 1 schematically illustrates a thermal chemical vapor deposition system 10 for depositing a layer on a substrate, for example a metal layer from a metal carbonyl precursor, according to one embodiment. While other precursors may be used, embodiments of the invention may henceforth be described with particular reference to metal carbonyl precursors and specifically ruthenium carbonyl precursors, such as $Ru_3(CO)_{12}$, for depositing metal layers and specifically ruthenium metal layers, with the understanding that the invention is not so limited. The deposition system 10 comprises a process chamber 12 having a substrate holder 14 configured to support a substrate 16, upon which the metal layer is formed. The process chamber 12 is coupled to a metal precursor vaporization system 20 via a vapor precursor delivery system 18.

The process chamber 12 is further coupled to a vacuum pumping system 24 through a duct 22, wherein the vacuum pumping system 24 is configured to evacuate the process chamber 12, vapor precursor delivery system 18, and metal precursor vaporization system 20 to a pressure suitable for forming the metal layer on the substrate 16, and suitable for evaporation (or sublimation) of the metal carbonyl precursor 26 in the metal precursor vaporization system 20.

Still referring to FIG. 1, the metal precursor vaporization system 20 is configured to store a metal carbonyl precursor 26, to heat the metal carbonyl precursor 26 to a temperature sufficient for vaporizing the metal carbonyl precursor 26, and to introduce metal carbonyl precursor vapor to the vapor precursor delivery system 18. The metal carbonyl precursor 26 can be solid under the selected heating conditions in the metal precursor vaporization system 20. Alternately, the metal carbonyl precursor 26 can be a liquid. The terms "vaporization", "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. Below, the use of a solid metal carbonyl precursor 26 is described; however, those skilled in the art will appreciate that metal carbonyl precursors that are liquids under the selected heating conditions can be used without departing from the scope of the invention. For instance, the metal carbonyl precursor 26 can have the general formula $M_x(CO)_y$, and can comprise a tungsten carbonyl, a molybdenum carbonyl, a cobalt carbonyl, a rhodium carbonyl, a rhenium carbonyl, a chromium carbonyl, or an osmium carbonyl, or a combination of two or more thereof. These metal carbonyls include, but are not limited to, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

To achieve the desired temperature for vaporizing the metal carbonyl precursor 26 (e.g., subliming the solid metal carbonyl precursor 26), the metal precursor vaporization system 20 is coupled to a vaporization temperature control system 28 configured to control the vaporization temperature. For instance, the temperature of the metal carbonyl precursor 26 is generally elevated to approximately 40° C. to 45° C. in conventional systems in order to sublime the ruthenium carbonyl $Ru_3(CO)_{12}$. At this temperature, the vapor pressure of the $Ru_3(CO)_{12}$, for instance, ranges from approximately 1 to approximately 3 mTorr. As the metal carbonyl precursor 26 is heated to cause vaporization, a carrier gas can be passed over or through the metal carbonyl precursor 26, or any combination thereof. The carrier gas can include, for example, an inert gas, such as a noble gas, He, Ne, Ar, Kr, or Xe, or a combination of two or more thereof.

According to an embodiment of the invention, a gas supply system 30 is coupled to the metal precursor vaporization system 20, and it is configured to, for instance, supply a carrier gas beneath the metal carbonyl precursor 26 via feed line 32, or over the metal carbonyl precursor 26 via feed line 34. In addition, or in the alternative, the gas supply system 30 is coupled to the vapor precursor delivery system 18 downstream from the metal precursor vaporization system 20 to supply the carrier gas to the vapor of the metal carbonyl precursor 26 via feed line 36 as or after it enters the vapor precursor delivery system 18. Although not shown, the gas supply system 30 can comprise a carrier gas source, one or more control valves, one or more filters, and a mass flow controller. For instance, the flow rate of the carrier gas can range from approximately 0.1 sccm to approximately 1000 sccm.

Downstream from the metal precursor vaporization system 20, the metal precursor vapor flows with the carrier gas through the vapor precursor delivery system 18 until it enters a gas distribution system 50 positioned at an inlet of the process chamber 12. The vapor precursor delivery system 18 can be coupled to a vapor line temperature control system 38 in order to control the vapor line temperature and prevent decomposition of the metal precursor vapor as well as condensation of the metal precursor vapor. For example, the vapor line temperature can be set to a value approximately equal to or greater than the vaporization temperature. Additionally, for example, the vapor precursor delivery system 18 can be characterized by a high conductance in excess of about 50 liters/second.

Referring again to FIG. 1, the gas distribution system 50, coupled to the process chamber 12, comprises a plenum 52 within which the vapor disperses prior to passing through a vapor distribution plate 54 and entering a process space 13 above substrate 16. In addition, the vapor distribution plate 54 can be coupled to a distribution plate temperature control system 56 configured to control the temperature of the vapor distribution plate 54. For example, the temperature of the vapor distribution plate 54 can be set to a value approximately equal to the vapor line temperature. However, it may be less, or it may be greater.

Once metal precursor vapor enters the process space 13, the metal precursor vapor thermally decomposes upon adsorption at the substrate surface due to the elevated temperature of the substrate 16, and the thin metal film is formed on the substrate 16. The substrate holder 14 is configured to elevate the temperature of substrate 16 by virtue of the substrate holder 14 being coupled to a substrate temperature control system 40. For example, the substrate temperature control system 40 can be configured to elevate the temperature of substrate 16 up to approximately 500° C. Additionally, process chamber 12 can be coupled to a chamber temperature control system 42 configured to control the temperature of the chamber walls.

Still referring the FIG. 1, the deposition system 10 can further include a control system 44 configured to operate and control the operation of the deposition system 10. The control system 44 is coupled to the process chamber 12, the substrate holder 14, the substrate temperature control system 40, the chamber temperature control system 42, the gas distribution system 50, the vapor precursor delivery system 18, the metal precursor vaporization system 20, and the gas supply system 30.

As described above, in low-pressure metal carbonyl systems in particular, domed or center-enhanced barrier layers may deposit on the substrate 16 when it is desired to have a uniform barrier layer. To counter-act the tendency toward non-uniform, domed deposition, vapor distribution systems have been contemplated that use a vapor distribution plate 54 with a non-uniform arrangement of orifices to control the relative flow rate of precursor vapor through the central radial portion and outer radial portion of the vapor distribution plate 54 to thereby alter the deposition profile of the layer on the substrate 16 from domed to uniform. However, as described above, if one or more process parameters for the deposition system 10 need to be adjusted, such systems may require a work stoppage to re-design and replace the vapor distribution plate 54 inside the gas distribution system 50 because the change in the process parameters will likely affect the relative flow rates through the different portions of the vapor distribution plate 54 and thereby alter the deposition profile. In addition, if it is desirable to switch between different flow rate profiles, for example, such that some processing is performed with a center-enhanced flow while other processing is performed with uniform flow or edge-enhanced flow, the vapor distribution plate 54 would have to be changed for each flow profile, which is neither practical nor efficient.

The system of the present invention allows for changes in the process parameters and/or flow profiles without requiring a corresponding change in the design of the vapor distribution plate 54. To that end, referring still to FIG. 1, and further referring to FIG. 2, which depicts one embodiment of the gas distribution system 50 and process chamber 12 of FIG. 1 in greater detail, a piston 60 is disposed in the plenum 52, and which is vertically movable within the plenum 52 by virtue of being coupled to a z-drive 61 mounted above the process chamber 12. Vertical positioning of the plenum determines flow distribution through the vapor distribution plate 54. The gas distribution system 50 of the invention comprises a housing 58 coupled to or within the process chamber 12 of the deposition system 10. Vapor distribution plate 54 is coupled to the housing 58 and together they form the plenum 52 in which the piston 60 is disposed. The gas distribution system 50 is configured to receive a process gas (comprising, for example, a metal precursor vapor and carrier gas) into the plenum 52 from vapor precursor delivery system 18 through an inlet 62 of the housing 58. The housing 58 also includes an outer circumferential edge 64, and the inlet 62 can include a gas delivery ring 66 with multiple circumferential orifices 68 to deliver process gas into the plenum 52 adjacent to the outer circumferential edge 64 of the housing 58.

The vapor distribution plate 54 comprises a plurality of orifices 70 arranged to introduce and distribute the process gas from plenum 52 to process space 13 proximate substrate 16 upon which a film or layer is to be formed. The piston 60 defines a flow path for the process gas, and this flow path extends from the inlet 62 to an upper plenum portion 71 located between the piston 60 and the outer circumferential edge 64 of the housing 58, and further to a lower plenum portion 73 located between the piston 60 and the vapor distribution plate 54. The piston 60 is vertically movable, which changes the dimensions of the lower plenum portion 73 and the flow pattern of process gas through the plenum 52. The piston 60 may have, for example, a flat profile oriented substantially parallel to the vapor distribution plate 54. Alternatively, the piston 60 may have a convex profile oriented towards the vapor distribution plate 54. Other profiles are also contemplated. Different piston profiles can add a level of control to compensate for different levels of radial diffusion of process gas within the process chamber 12.

Figure 2:
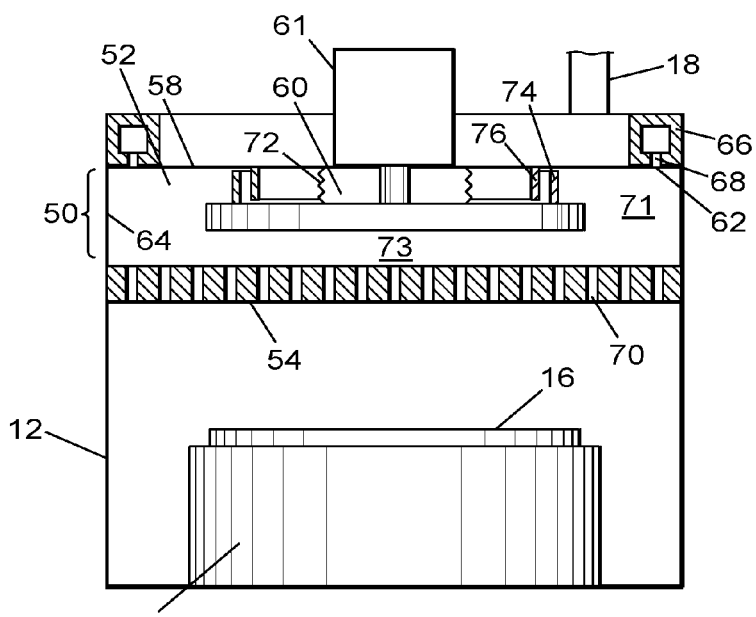
FIG. 2 is a front schematic view of a gas distribution system and a substrate processing chamber according to one embodiment of the invention.

In one embodiment, the gas distribution system 50 can further comprise a bellows 72 coupled to the piston 60 and the housing 58. The bellows 72 helps maintain vacuum integrity in the deposition system 10 so that the deposition process can happen at sufficiently low pressures. The gas distribution system 50 can also comprise a first concentric shield 74 coupled to the piston 60 and a second concentric shield 76 coupled to the housing 58. As shown in FIG. 2, the second concentric shield 76 overlaps the first concentric shield 74. Together these shields 74, 76 help prevent loose particles escaping from the bellows 72 and into the plenum 52 and process chamber 12.

Figure 3A:
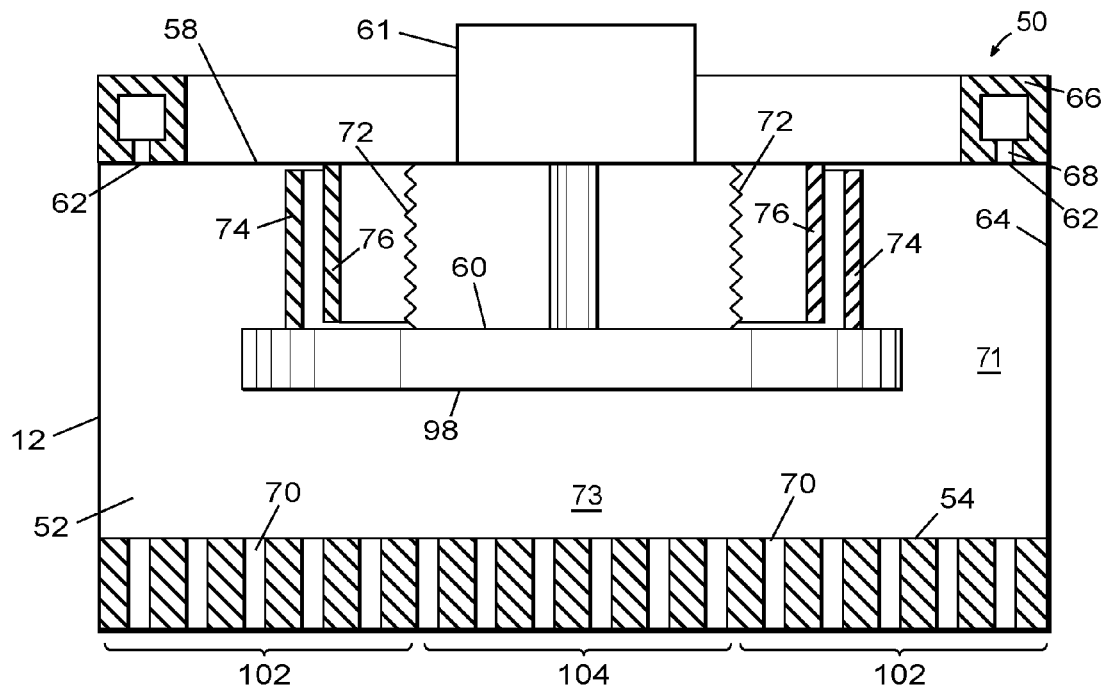
FIGS. 3A-3B are cross-sectional views of one embodiment of the gas distribution system of FIG. 2, having the piston positioned in upper and lower positions, respectively.
Figure 3B:
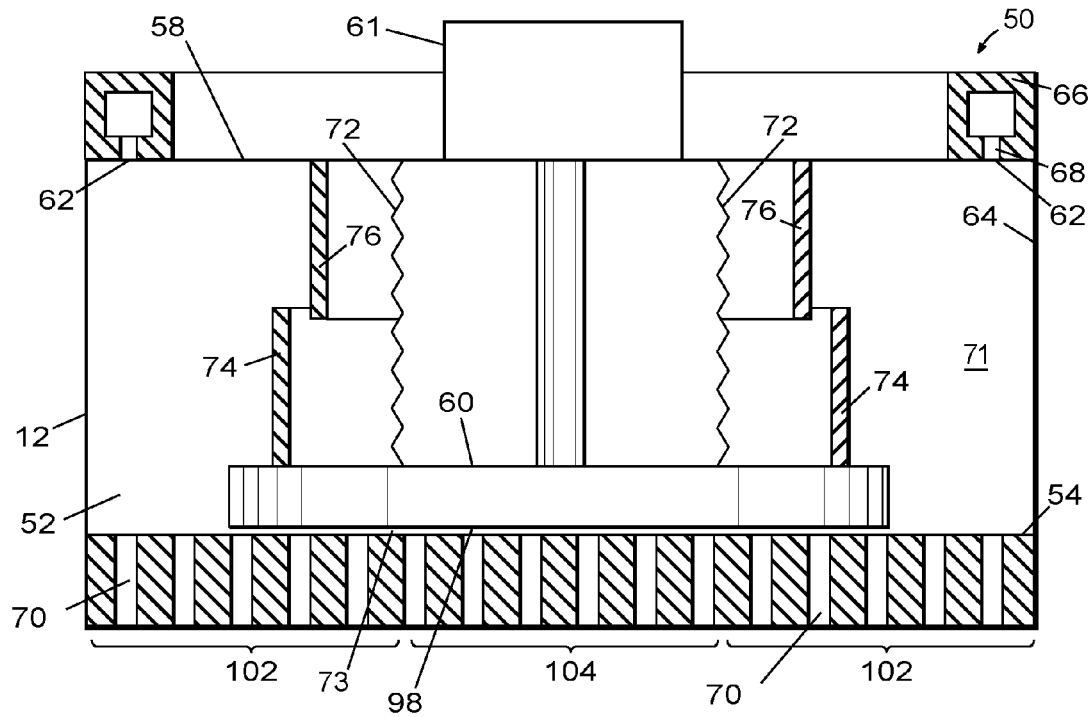

Referring now to FIGS. 3A and 3B, an embodiment of a gas distribution system 50 is shown, wherein the piston 60 is positioned in an upper position and a lower position, respectively. In this embodiment, the gas distribution system 50 comprises the same components of the above-described gas distribution system 50, specifically, housing 58, inlet 62, vapor distribution plate 54, plenum 52, vertically movable piston 60, bellows 72, first concentric shield 74, second concentric shield 76, and plurality of orifices 70. In this embodiment, the plurality of orifices 70 is shown having a radially uniform pattern. In other words, the size, quantity, and spacing of the orifices 70 are equal in each of an outer radial portion 102 and a central radial portion 104 of the vapor distribution plate 54. Furthermore, the piston 60 of this embodiment has a flat profile 98 oriented substantially parallel to the vapor distribution plate 54. Consequently, when the piston 60 is raised to an upper position, as depicted in FIG. 3A, the process gas flows uniformly from the inlet 62, through upper plenum 71 and lower plenum 73, and through the outer and central radial portions 102, 104 of the vapor distribution plate 54. In the upper position, the piston 60 may be spaced about 0.5 inch to about 2.0 inches above the vapor distribution plate 54 to achieve the generally uniform flow of the process gas through the outer radial portion 102 and central radial portion 104 of the vapor distribution plate 54.

When the piston 60 is lowered to a lower position, as depicted in FIG. 3B, the process gas flows from the inlet through upper plenum 71 and through at least some of the orifices 70 in the outer radial portion 102 of vapor distribution plate 54, with lesser or little flow through lower plenum 73 and central radial portion 104, depending on the spacing between the piston 60 and vapor distribution plate 54. Consequently, process gas flow is greater through an outer radial portion 102 of the vapor distribution plate 54 than through a central radial portion 104 of the vapor distribution plate 54. In the lower position, the piston 60 may be spaced about 0.05 inch to about 0.4 inch above the vapor distribution plate 54 to achieve a greater relative flow of process gas through the outer radial portion 102 of the vapor distribution plate 54 than through the central radial portion 104 of the vapor distribution plate 54. As shown, when the spacing is toward the lower end of the range, for example, about 0.05-0.1 inch, the plenum 73 is nearly eliminated or cut-off, so that little to essentially no process gas can flow to the orifices 70 positioned in the vapor distribution plate 54 beneath the piston 60, in particular the orifices 70 in the central radial portion 104. When the spacing is toward the upper end of the range, for example, about 0.3-0.4 inch, process gas will flow into plenum 73 and through the central radial portion 104, but a slower rate than the flow through the outer radial portion 102.

Figure 4:
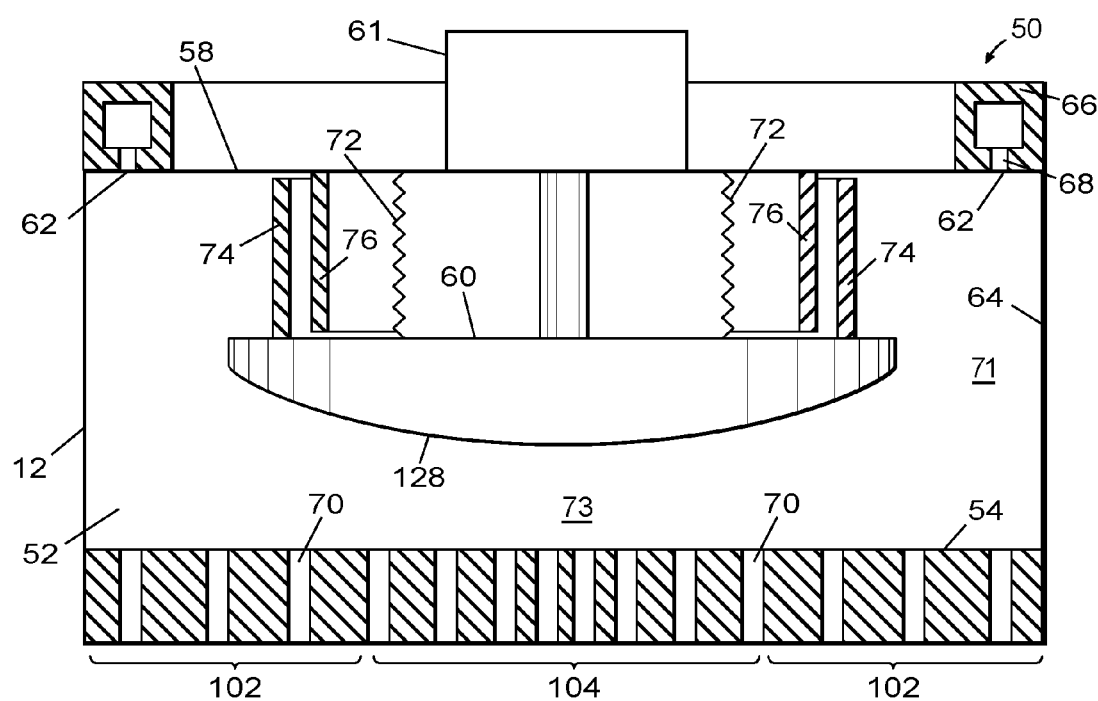
FIG. 4 is a cross-sectional view of another embodiment of the gas distribution system of FIG. 2.

Referring now to FIG. 4, another embodiment of a gas distribution system 50 is shown. In this embodiment, the gas distribution system 50 comprises the same components as the above-described gas distribution system 50, specifically, housing 58, inlet 62, vapor distribution plate 54, plenum 52, vertically movable piston 60, bellows 72, first concentric shield 74, second concentric shield 76, and plurality of orifices 70. In this embodiment, the plurality of orifices 70 is shown having a radially non-uniform pattern. The vapor distribution plate 54 of this embodiment achieves the non-uniform pattern by having a greater number of orifices 70 in the central radial portion 104 of the vapor distribution plate 54 than in the outer radial portion 102 of the vapor distribution plate 54. The orifices 70 are depicted with an equal size, but are more closely spaced together in the central radial portion 104. However, a non-uniform pattern could also be achieved by having an equal spacing between orifices 70 but with the orifices in the central radial portion 104 being greater in size (volume). Furthermore, in this embodiment, the piston 60 has a convex profile 128 oriented towards the vapor distribution plate 54. Consequently, when the piston 60 is in a lower position (not shown), the process gas flows uniformly from the inlet 62, through upper plenum 71 and lower plenum 73, and through the outer and central radial portions 102, 104 of the vapor distribution plate 54. When the piston 60 is in an upper position as depicted, the process gas flow is greater through the central radial portion 104 of the vapor distribution plate 54 than through the outer radial portion 102.

The invention also provides a method of distributing a process gas into a process chamber 12 of a deposition system 10. Embodiments of the method use the gas distribution system 50 as described in FIGS. 1-4, including the housing 58, a vapor distribution plate 54 coupled to the housing 58 to create a plenum 52, a plurality of orifices 70 in the vapor distribution plate 54, and a vertically movable piston 60 located in the plenum 52. The method comprises moving the piston 60 to a desired location in the plenum 52, so as to create a desired spacing between the piston 60 and vapor distribution plate 54 and thus a desired volume for lower plenum 73. The method further includes introducing a process gas into the inlet 62 of the gas distribution system 50 and flowing the process gas from the inlet 62 to the upper plenum portion 71 and further to the lower plenum portion 73 and flowing the process gas through the plurality of orifices 70 into the process chamber 12. The location of the piston 60, and consequently the volume of lower plenum 73, determines, at least in part, the relative flow rate of process gas through an outer radial portion 102 and a central radial portion 104 of the vapor distribution plate 54. The pattern of orifices 70 and profile of piston 60 may also determine, in part, the relative flow rate.

As disclosed above, the process gas used in the method can contain a metal-carbonyl precursor vapor in one embodiment. The process gas may also include a carrier gas in some embodiments. The process chamber 12 used in the method may include a substrate holder 14 for holding a substrate 16, and the method can then include exposing the substrate 16 to the process gas flowing into the process chamber 12 to deposit a layer on the substrate 16 by a chemical vapor deposition process. By following this method, a thin film or layer of material, such as ruthenium metal, can be deposited on a substrate 16, and the effects of radial diffusion of process gas can be controlled by the gas distribution system 50.

In another embodiment of the method, where the gas distribution system 50 is as shown in FIG. 3A and described above, where piston 60 has a flat profile 98 and the plurality of orifices 70 is radially uniform, the method further comprises moving the piston 60 to the upper position so that the piston 60 is about 0.5 inch to about 2.0 inches above the vapor distribution plate 54 to achieve generally uniform flow of the process gas through the outer radial portion 102 and central radial portion 104 of the vapor distribution plate 54. In an alternative embodiment, where the gas distribution system 50 is as shown in FIG. 3B and described above, where piston 60 has a flat profile 98 and the plurality of orifices 70 is radially uniform, the method further comprises moving the piston 60 to the lower position so that the piston 60 is about 0.05 inch to about 0.4 inch above the vapor distribution plate 54 to achieve a higher relative flow of process gas through the outer radial portion 102 of the vapor distribution plate 54 than through the central radial portion 104 of the vapor distribution plate 54.

In yet another embodiment of the method, the gas distribution system 50 is as shown in FIG. 4 and described above, where the piston 60 has a convex profile 128 and the plurality of orifices 70 is radially non-uniform, with more orifices 70 in the central radial portion 104 of the vapor distribution plate 54 than in the outer radial portion 102 of the vapor distribution plate 54. The method then further comprises moving the piston 60 to the upper position so that the piston 60 is about 0.5 inch to about 2.0 inches above the vapor distribution plate 54 to achieve a greater relative flow of process gas through the central radial portion 104 of the vapor distribution plate 54 than through the outer radial portion 102 of the vapor distribution plate 54. In an alternative embodiment, the method further comprises moving the piston 60 to a lower position so that the piston 60 is about 0.05 inch to about 0.4 inch above the vapor distribution plate 54 to achieve generally uniform flow of the process gas through the outer radial portion 102 and central radial portion 104 of the vapor distribution plate 54.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A gas distribution system configured to be coupled to or within a process chamber for depositing a layer on a substrate, the gas distribution system comprising:
   a housing including an inlet and an outer circumferential edge;
   a vapor distribution plate coupled to the housing to define a plenum between the inlet and the vapor distribution plate, the vapor distribution plate including a plurality of orifices for distributing a process gas from the plenum to a process space above said substrate; and
   a solid plate-shaped piston disposed in the plenum having continuous upper and lower surfaces that prevent gas flow therethrough to define a flow path for the process gas that extends around the solid plate-shaped piston from the inlet to an upper plenum portion between the solid plate-shaped piston and the outer circumferential edge of the housing and to a lower plenum portion between the solid plate-shaped piston and the vapor distribution plate;
   wherein the solid plate-shaped piston is vertically moveable from an upper position to a lower position in which the process gas flows around the solid plate-shaped piston and through the plurality of orifices with the relative flow through an outer radial portion of the plurality of orifices versus through a central radial portion of the plurality of orifices being uniform in one of the upper or lower positions and non-uniform in the other of the upper and lower positions.

2. The gas distribution system of claim 1, further comprising a bellows coupled to the solid plate-shaped piston and the housing for maintaining a vacuum in the gas distribution system.

3. The gas distribution system of claim 2, further comprising a first concentric shield coupled to the solid plate-shaped piston and a second concentric shield coupled to the housing, wherein the first and second concentric shields overlap and are adjacent to the bellows to prevent particles from the bellows from entering the plenum and the process chamber.

4. The gas distribution system of claim 1, wherein the solid plate-shaped piston has a flat profile and is oriented substantially parallel to the vapor distribution plate.

5. The gas distribution system of claim 1, wherein the solid plate-shaped piston has a convex profile oriented towards the vapor distribution plate.

6. The gas distribution system of claim 1, wherein the inlet of the housing includes a gas delivery ring having multiple circumferential orifices for delivering gas adjacent to the outer circumferential edge of the housing.

7. The gas distribution system of claim 1, wherein the plurality of orifices are oriented in a radially uniform pattern.

8. The gas distribution system of claim 7, wherein the solid plate-shaped piston has a flat profile and is oriented substantially parallel to the vapor distribution plate.

9. The gas distribution system of claim 1, wherein the plurality of orifices are oriented in a radially non-uniform pattern.

10. The gas distribution system of claim 9, wherein the solid plate-shaped piston has a convex profile oriented towards the vapor distribution plate.

11. The gas distribution system of claim 10, wherein the vapor distribution plate comprises a greater number of orifices in the central radial portion than in the outer radial portion whereby moving the solid plate-shaped piston to the upper position causes a greater process gas flow through the central radial portion than through the outer radial portion.

12. A gas distribution system configured to be coupled to or within a process chamber for depositing a layer on a substrate, the gas distribution system comprising:
a housing including an outer circumferential edge and in inlet adjacent thereto;
a vapor distribution plate coupled to the housing to define a plenum between the inlet and the vapor distribution plate, the vapor distribution plate including a plurality of orifices for distributing a process gas from the plenum to a process space above said substrate; and
a piston structure having an actuating rod and a solid plate-shaped piston disposed centrally in the plenum to divide the plenum into an outer circumferential plenum portion between the plate-shaped piston and the outer circumferential edge of the housing above an outer radial portion of the plurality of orifices and into a central plenum portion between the plate-shaped piston and the vapor distribution plate above a central radial portion of the plurality of orifices, and the solid plate-shaped piston having continuous upper and lower surfaces that prevent gas flow therethrough thereby defining a flow path for the process gas that extends from the inlet downwardly through the outer circumferential plenum portion and then partially through the outer radial portion of the of the plurality of orifices and partially inward through the central plenum portion and through the central radial portion of the plurality of orifices;
wherein the solid plate-shaped piston is vertically moveable by the actuating rod between an upper position having a first volume for each of the outer circumferential plenum portion and the central plenum portion and a lower position having a second volume for each of the outer circumferential plenum portion and the central plenum portion in which the first volume of the outer circumferential plenum portion is less than the second volume, and the first volume of the central plenum portion is greater than the second volume, to enable different flow rates for the process gas along the flow path in the outer circumferential plenum portion and the central plenum portion between the upper and lower positions and thereby a change in the relative flow of the process gas through the outer radial portion of the plurality of orifices versus through the central radial portion of the plurality of orifices where the relative flow is uniform in one of the upper or lower positions and non-uniform in the other of the upper and lower positions.

13. The gas distribution system of claim 1, wherein the solid plate-shaped piston has a flat profile oriented towards the vapor distribution plate and the plurality of orifices in the vapor distribution plate is oriented in a radially uniform pattern with the relative flow of the process gas being uniform through the outer radial and central radial portions of the plurality of orifices in the upper position and non-uniform in the lower position.

14. A gas distribution system configured to be coupled to or within a process chamber for depositing a layer on a substrate, the gas distribution system comprising:
a housing including an inlet and an outer circumferential edge;
a vapor distribution plate coupled to the housing to define a plenum between the inlet and the vapor distribution plate, the vapor distribution plate including a plurality of orifices for distributing a process gas from the plenum to a process space above said substrate; and
a solid piston disposed in the plenum and having a plate shape with continuous upper and lower surfaces that prevent as flow therethrough, the lower surface of flat, concave or convex profile, wherein a spacing is defined between the lower surface and the vapor distribution plate, and wherein the solid piston defines a flow path for the process gas that extends around the solid piston from the inlet to an upper plenum portion between the solid piston and the outer circumferential edge of the housing and to a lower plenum portion in the spacing between the lower surface and the vapor distribution plate;
wherein the solid piston is vertically moveable from an upper position to a lower position to vary the spacing, and wherein the spacing defines the relative flow through an outer radial portion of the plurality of orifices versus through a central radial portion of the plurality of orifices, with the relative flow being uniform in one of the upper or lower positions and non-uniform in the other of the upper and lower positions.

15. The gas distribution system of claim 14, wherein the spacing is 0.5 to 2 inches when the solid piston is in the upper position and 0.05 to 0.4 inch when the solid piston is in the lower position.

16. The gas distribution system of claim 14, wherein the smooth bottom surface has a flat profile oriented towards the vapor distribution plate and the plurality of orifices in the vapor distribution plate is oriented in a radially uniform pattern with the relative flow of the process gas being uniform through the outer radial and central radial portions of the plurality of orifices in the upper position and non-uniform in the lower position.

17. The gas distribution system of claim 14, wherein the smooth bottom surface has a convex profile oriented towards the vapor distribution plate and the plurality of orifices in the vapor distribution plate is oriented in a radially non-uniform pattern with a greater number of orifices in the central radial portion than in the outer radial portion whereby the relative flow of the process gas is uniform through the outer radial and central radial portions of the plurality of orifices in the upper position and non-uniform in the lower position.

* * * * *

UNITED STATES PATENT AND TRADEMARK OFFICE
CERTIFICATE OF CORRECTION

PATENT NO. : 8,252,114 B2
APPLICATION NO. : 12/058070
DATED : August 28, 2012
INVENTOR(S) : Mirko Vukovic It is certified that error appears in the above-identified patent and that said Letters Patent is hereby corrected as shown below:

In Col. 2, line 2, "gas flow rate change" should read --gas flow rate changes--.

In Col. 8, line 54, "but a slower rate" should read --but at a slower rate--.

In Col. 11, lines 31-32, Claim 12, "and in inlet" should read --and an inlet--.

In Col. 11, lines 52-53, Claim 12, "portion of the of the plurality" should read --portion of the plurality--.

In Col. 12, line 28, Claim 14, "prevents as flow" should read --prevents gas flow--.

Signed and Sealed this
Fifth Day of February, 2013

Teresa Stanek Rea
*Acting Director of the United States Patent and Trademark Office*